(12) United States Patent
Chen et al.

(10) Patent No.: US 10,049,940 B1
(45) Date of Patent: Aug. 14, 2018

(54) STRUCTURE AND METHOD FOR METAL GATES WITH ROUGHENED BARRIER LAYER

(71) Applicant: Taiwan Semiconductor Manufacturing Co., Ltd., Hsinchu (TW)

(72) Inventors: Yen-Ting Chen, Hsinchu (TW); Chia-Lin Hsu, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/800,164

(22) Filed: Nov. 1, 2017

Related U.S. Application Data

(60) Provisional application No. 62/550,395, filed on Aug. 25, 2017.

(51) Int. Cl.
| | |
|---|---|
| H01L 29/51 | (2006.01) |
| H01L 21/8234 | (2006.01) |
| H01L 29/423 | (2006.01) |
| H01L 29/20 | (2006.01) |
| H01L 21/28 | (2006.01) |
| H01L 21/02 | (2006.01) |
| H01L 21/283 | (2006.01) |
| H01L 29/06 | (2006.01) |
| H01L 23/532 | (2006.01) |
| H01L 29/49 | (2006.01) |

(52) U.S. Cl.
CPC ........ *H01L 21/823462* (2013.01); *H01L 21/02263* (2013.01); *H01L 21/283* (2013.01); *H01L 21/28176* (2013.01); *H01L 23/53223* (2013.01); *H01L 23/53266* (2013.01); *H01L 29/0611* (2013.01); *H01L 29/2003* (2013.01); *H01L 29/4236* (2013.01); *H01L 29/495* (2013.01); *H01L 29/51* (2013.01); *H01L 29/511* (2013.01); *H01L 29/517* (2013.01)

(58) Field of Classification Search
None
See application file for complete search history.

(56) References Cited

U.S. PATENT DOCUMENTS

| | | |
|---|---|---|
| 9,431,304 B2 | 8/2016 | Huang et al. |
| 9,799,745 B2 | 10/2017 | Lee et al. |
| 2007/0134922 A1 | 6/2007 | Mori et al. |

(Continued)

OTHER PUBLICATIONS

Tosatti, S. et al., "Self-Assembled Monolayers of Dodecyl and Hydroxy-dodecyl Phosphates on Both Smooth and Rough Titanium and Titanium Oxide Surfaces", Langmuir, vol. 18, Apr. 5, 2002, pp. 3537-3548.

*Primary Examiner* — Minh-Loan Tran
(74) *Attorney, Agent, or Firm* — Haynes and Boone, LLP

(57) ABSTRACT

A method of forming a semiconductor device includes receiving a structure having a substrate, a gate trench over the substrate, and a dielectric layer over the substrate and surrounding the gate trench. The method further includes forming a gate dielectric layer in the gate trench, forming a barrier layer in the gate trench and over the gate dielectric layer, and treating the barrier layer to roughen an outer surface of the barrier layer, resulting in a treated barrier layer. The method further includes forming an n-type work function metal layer over the treated barrier layer.

20 Claims, 16 Drawing Sheets

(56) References Cited

U.S. PATENT DOCUMENTS

| | | | |
|---|---|---|---|
| 2009/0267132 A1* | 10/2009 | Cha | H01L 21/28273 257/316 |
| 2013/0214336 A1* | 8/2013 | Hsu | H01L 21/2855 257/288 |
| 2016/0315164 A1 | 10/2016 | Son et al. | |
| 2016/0372565 A1 | 12/2016 | Huang et al. | |
| 2017/0110324 A1 | 4/2017 | Tsai et al. | |
| 2017/0110552 A1 | 4/2017 | Lee et al. | |

* cited by examiner

STRUCTURE AND METHOD FOR METAL GATES WITH ROUGHENED BARRIER LAYER

PRIORITY

This application claims the benefits of U.S. provisional application Ser. No. 62/550,395, filed Aug. 25, 2017, the entire disclosure of which is herein incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, when fabricating field effect transistors (FETs), such as fin-like FETs (FinFETs), device performance can be improved by using a high-k metal gate instead of a typically polysilicon gate. Work function of a high-k metal gate can be tuned by selecting materials and thickness of certain work function metal layer(s) in the high-k metal gate. As FET devices continue scaling down, lower threshold voltage (Vt) in gate terminals (directly related to work function thereof) is desired in order to further speed up the operation of the FET devices. However, it has been difficult to continually lower the work function of existing high-k metal gates, particularly for n-type FETs (or NFETs), due to the consideration of gate stack engineering and fabrication. For example, in order to reduce the interaction between a high-k dielectric layer and a work function metal layer, a barrier layer is typically placed between them. This barrier layer sometimes increases the work function of the metal gate.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
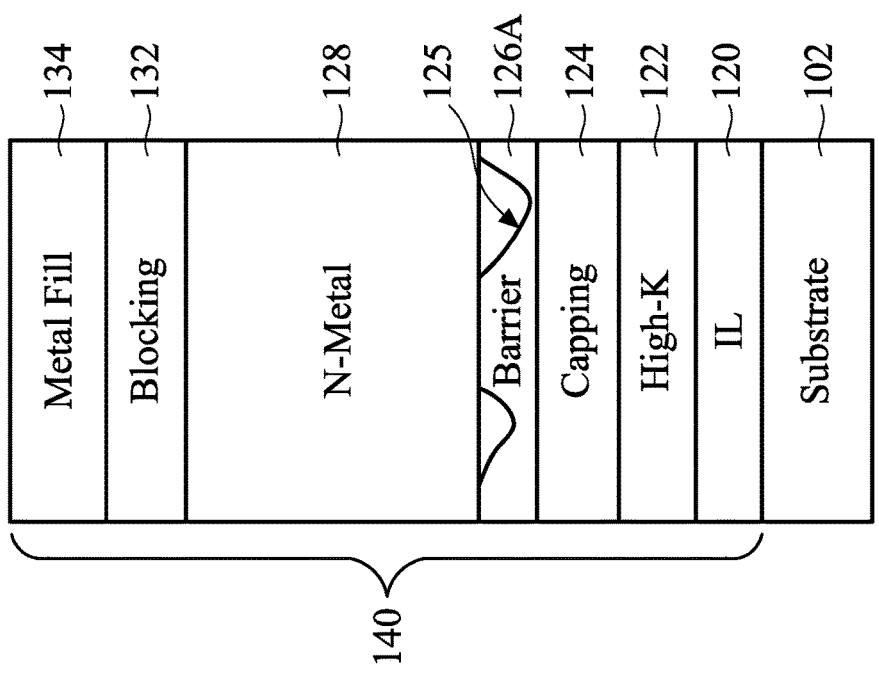
FIG. 1 shows a high-k metal gate stack constructed according to aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices, and more particularly to semiconductor field effect transistors (FET) having a high-k metal gate. An object of the present disclosure is to design and fabricate high-k metal gates so as to provide low work function for NFET.

Referring to FIG. 1, shown therein is a device 100 having a high-k metal gate 140 disposed over a substrate 102, constructed according to aspects of the present disclosure. Particularly, the high-k metal gate 140 is suitable for NFET in the present embodiment. In an embodiment, the device 100 may include two-dimensional (or 2-D) transistors where the high-k metal gate 140 is disposed on only one surface of an NFET channel. In another embodiment, the device 100 may include three-dimensional (or 3-D) transistors (such as FinFET or gate-all-around devices) where the high-k metal gate 140 is disposed on more than one surface of an NFET channel.

The high-k metal gate 140 in this embodiment includes an interfacial layer 120, a gate dielectric layer 122, a capping layer 124, a barrier layer 126A, an n-type work function metal layer 128, a blocking layer 132, and a metal fill layer 134 sequentially stacked one over the other. In some embodiments, the high-k metal gate 140 may include additional layers not shown herein. In some other embodiments, some layers shown in FIG. 1 may be omitted in the high-k metal gate 140.

The interfacial layer 120 may include a dielectric material such as silicon oxide layer ($SiO_2$) or silicon oxynitride (SiON), and may be formed using chemical oxidation, thermal oxidation, atomic layer deposition (ALD), chemical vapor deposition (CVD), and/or other suitable methods.

The gate dielectric layer 122 may include one or more high-k (e.g., k>3.9) dielectric materials, such as hafnium silicon oxide ($HfSiO_4$), hafnium oxide ($HfO_2$), alumina ($Al_2O_3$), zirconium oxide ($ZrO_2$), lanthanum oxide ($La_2O_3$), titanium oxide ($TiO_2$), yttrium oxide ($Y_2O_3$), strontium titanate ($SrTiO_3$), or a combination thereof. The gate dielectric layer 122 may also be referred to as the high-k dielectric layer 122. The gate dielectric layer 122 may be deposited using physical vapor deposition (PVD), CVD, ALD and/or other suitable methods.

The capping layer 124 may include a lanthanum-based oxide layer (e.g., $LaO_x$) in some embodiments. In some examples, the capping layer 124 may include other layers such as an $Al_2O_3$ layer, a $SiO_2$ layer, an $Y_2O_3$ layer, a titanium nitride (TiN) layer, a titanium silicon nitride (TiSiN) layer, a combination thereof, or other suitable capping layer. The capping layer 124 may be formed by PVD, CVD, ALD and/or other suitable methods.

The barrier layer 126A includes a metal nitride in the present embodiment, such as tantalum nitride, titanium nitride, or a combination thereof. The barrier layer 126A may be formed by PVD, CVD, ALD and/or other suitable methods. In the present embodiment, the barrier layer 126A has a roughened surface 125 adjacent to the n-type work function metal layer 128. This roughened surface 125 helps lower the work function of the high-k metal gate 140, which will be discussed in details below.

The n-type work function metal layer 128 may include one or more layers of conductive materials. Particularly, the n-type work function metal layer 128 comprises a metal with sufficiently low effective work function, selected from but not restricted to the group of titanium (Ti), aluminum (Al), zirconium (Zr), tantalum (Ta), niobium (Nb), titanium aluminum (TiAl), tantalum carbide (TaC), tantalum carbide nitride (TaCN), tantalum silicon nitride (TaSiN), titanium silicon nitride (TiSiN), titanium aluminum carbide (TiAlC), or combinations thereof. The n-type work function metal layer 128 may be formed by PVD, CVD, ALD and/or other suitable methods. Particularly in the present embodiment, the n-type work function metal layer 128 includes aluminum (Al) in its portion interfacing with the barrier layer 126A.

Experiments have shown that the roughened surface 125 benefits the high-k metal gate 140 by lowering its effective work function. The working principles of the roughened surface 125 are thought to be as follows. Since aluminum has a very low work function (about 4.1 eV), by having aluminum in the n-type work function metal layer 128, the work function of the high-k metal gate 140 may be lowered. However, the aluminum atoms of the n-type work function metal layer 128 are distanced from the high-k dielectric layer 122 by layers there-between such as the capping layer 124 and the barrier layer 126A. In the present embodiment, the roughened surface 125 are designed to allow the aluminum atoms of the work function metal layer 128 to diffuse through the barrier layer 126A. This effectively shortens the distance between the aluminum atoms and the high-k gate dielectric layer 122, which helps lower the work function of the high-k metal gate 140. In some embodiments, the barrier layer 126A may have a (peak) thickness of about 2 nm. Had the barrier layer 126A have a uniform thickness instead of having a roughened surface, the aluminum atoms of the n-type work function metal layer 128 would not be able to diffuse through the barrier layer 126A.

In an embodiment, the roughened surface 125 has an average surface roughness (Ra) of 3 to 10 Angstroms (Å), where Ra is the arithmetic average of the roughness profile of the surface 125. In another embodiment, the thickness of the barrier layer 126A may vary from 5 to 18 Å across the surface 125.

The blocking layer 132 may include titanium nitride, titanium aluminum oxide, or other suitable materials; and may be deposited by PVD, CVD, ALD and/or other suitable methods. The metal fill layer 134 may include aluminum (Al), tungsten (W), cobalt (Co), copper (Cu), and/or other suitable materials; and may be deposited using methods such as CVD, PVD, plating, and/or other suitable processes.

Figure 2A:
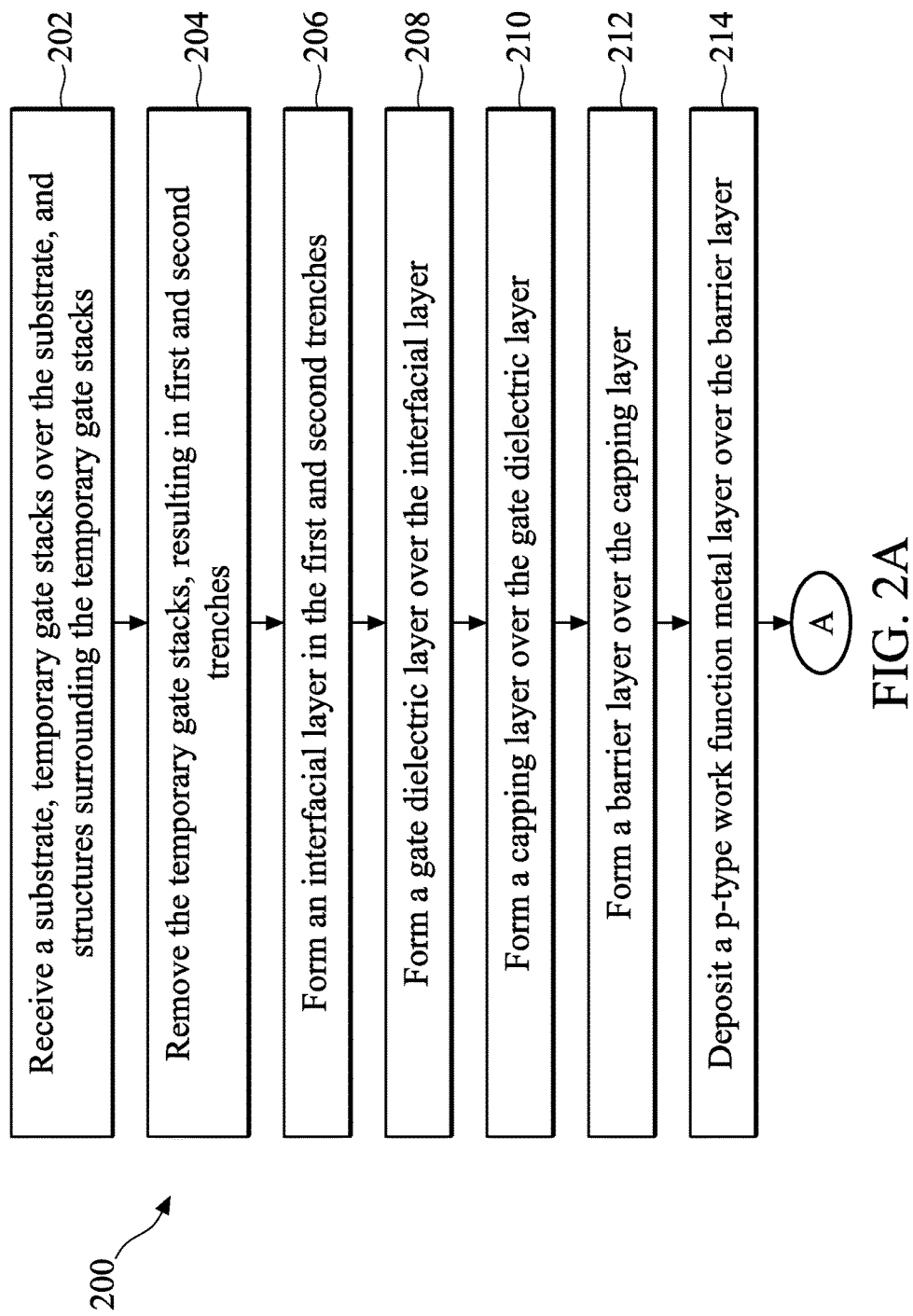
FIGS. 2A and 2B show a flow chart of a method of fabricating a semiconductor device, according to various aspects of the present disclosure.
Figure 2B:
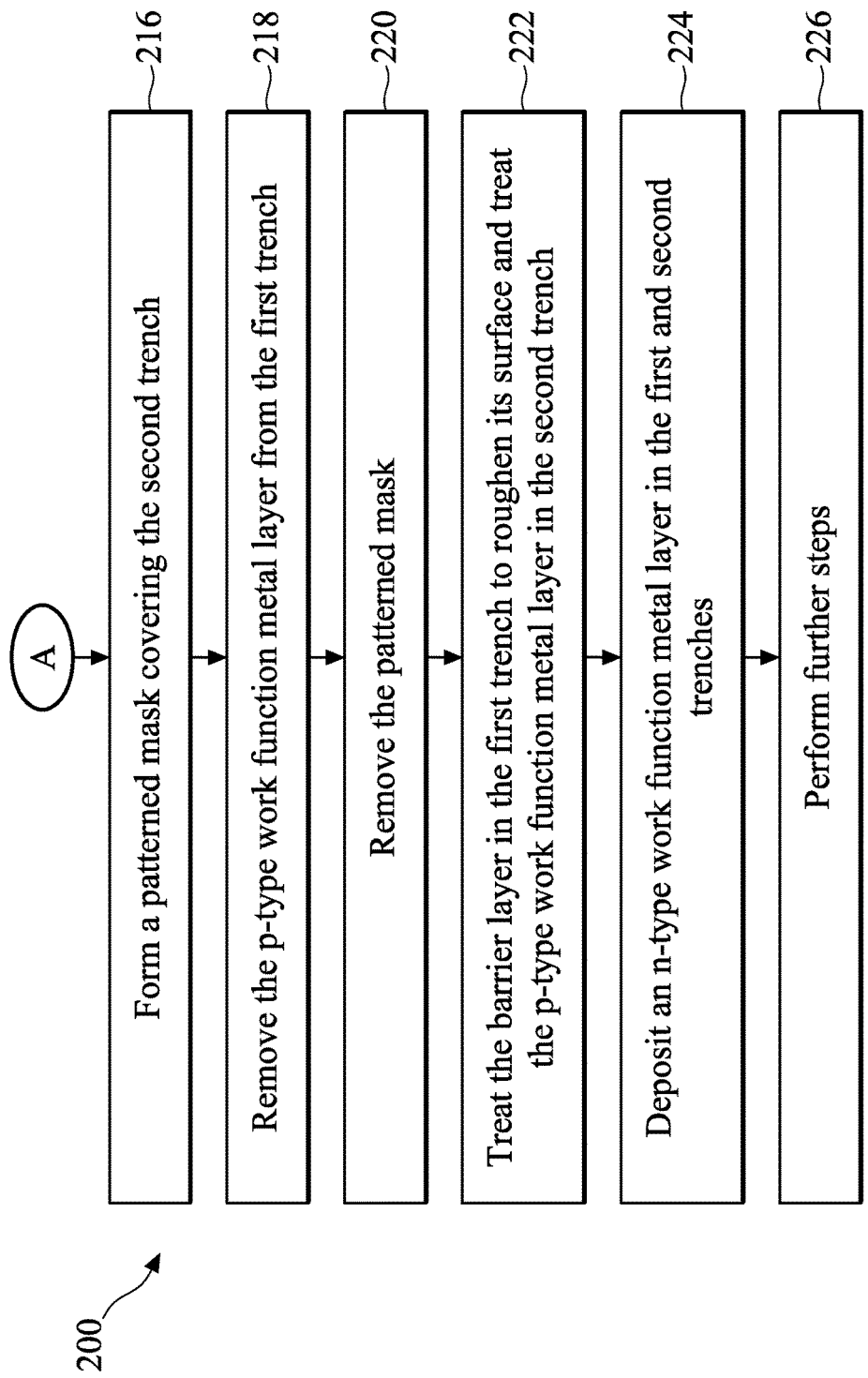

Referring now to FIGS. 2A and 2B, a flow chart of a method 200 of forming a semiconductor device, such as the device 100, is illustrated according to various aspects of the present disclosure. Particularly, the device 100 is fabricated to have a high-k metal gate with a roughened barrier layer, such as the high-k metal gate 140 (FIG. 1). The method 200 is merely an example, and is not intended to limit the present disclosure beyond what is explicitly recited in the claims. Additional operations can be provided before, during, and after the method 200, and some operations described can be replaced, eliminated, or moved around for additional embodiments of the method. The method 200 is described below in conjunction with FIGS. 3-13 that illustrate a portion of a semiconductor device 100 at various fabrication stages. The device 100 may be an intermediate device fabricated during processing of an IC, or a portion thereof, that may comprise SRAM and/or other logic circuits, passive components such as resistors, capacitors, and inductors, and active components such as p-type FETs (PFETs), n-type FETs (NFETs), FinFETs, metal-oxide semiconductor field effect transistors (MOSFET), complementary metal-oxide semiconductor (CMOS) transistors, bipolar transistors, high voltage transistors, high frequency transistors, other memory cells, and combinations thereof.

Figure 3:
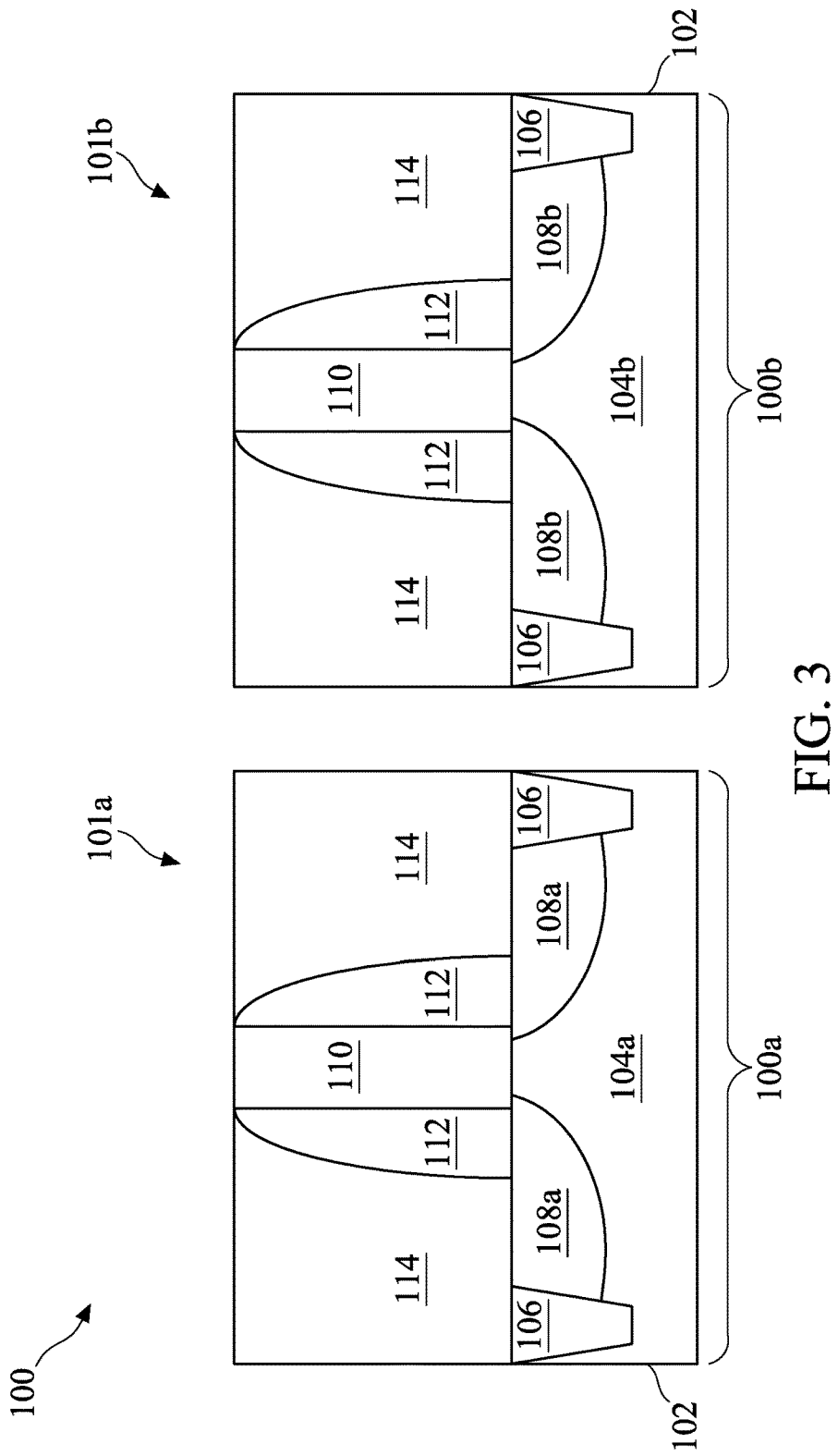
FIGS. 3, 4, 5, 6, 7, 8, 9, 10, 11, 12, 13, 14, and 15 are cross sectional views of forming a semiconductor device according to the method of FIGS. 2A and 2B, in accordance with some embodiments.
Figure 13:
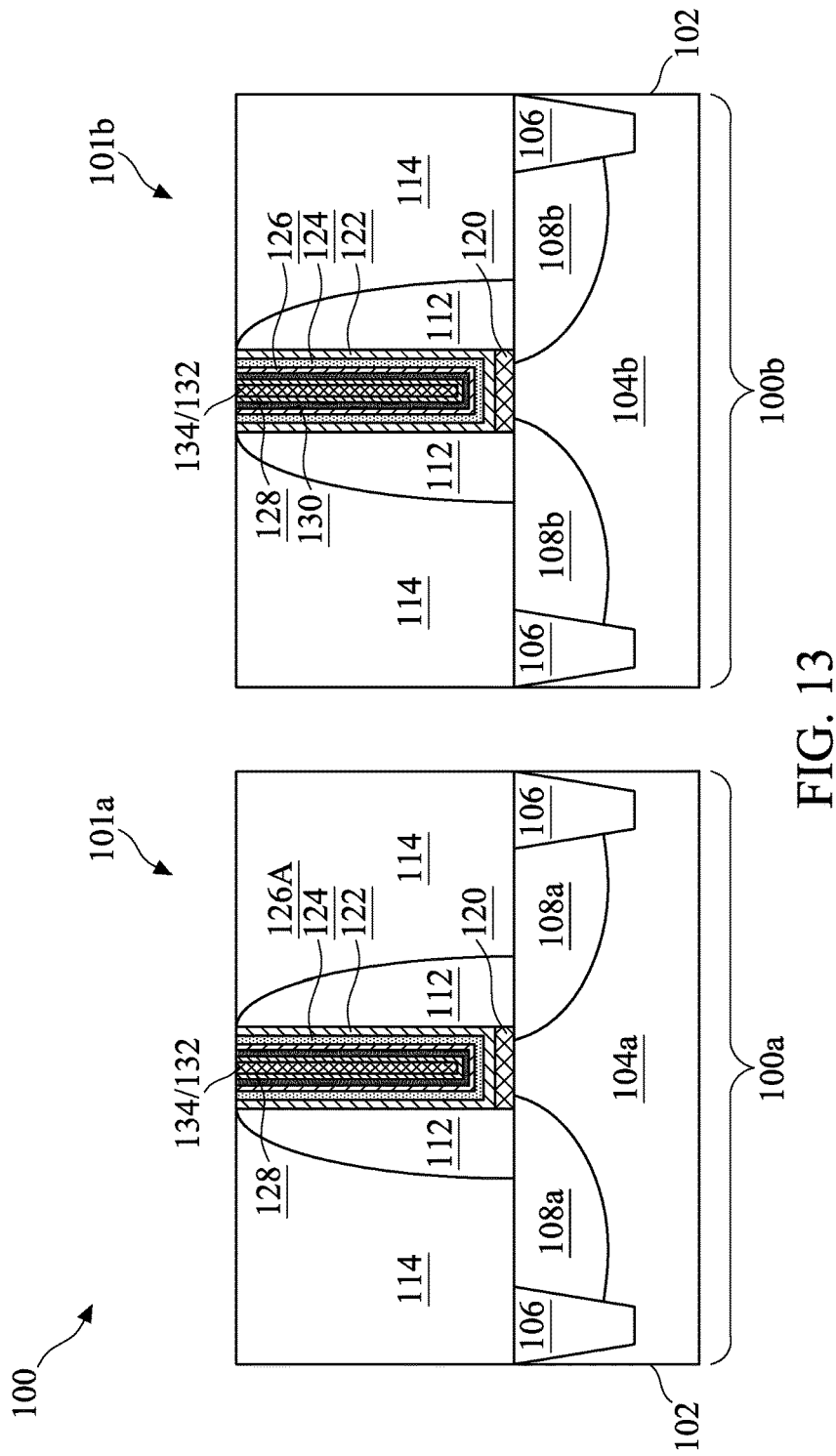
Figure 14:
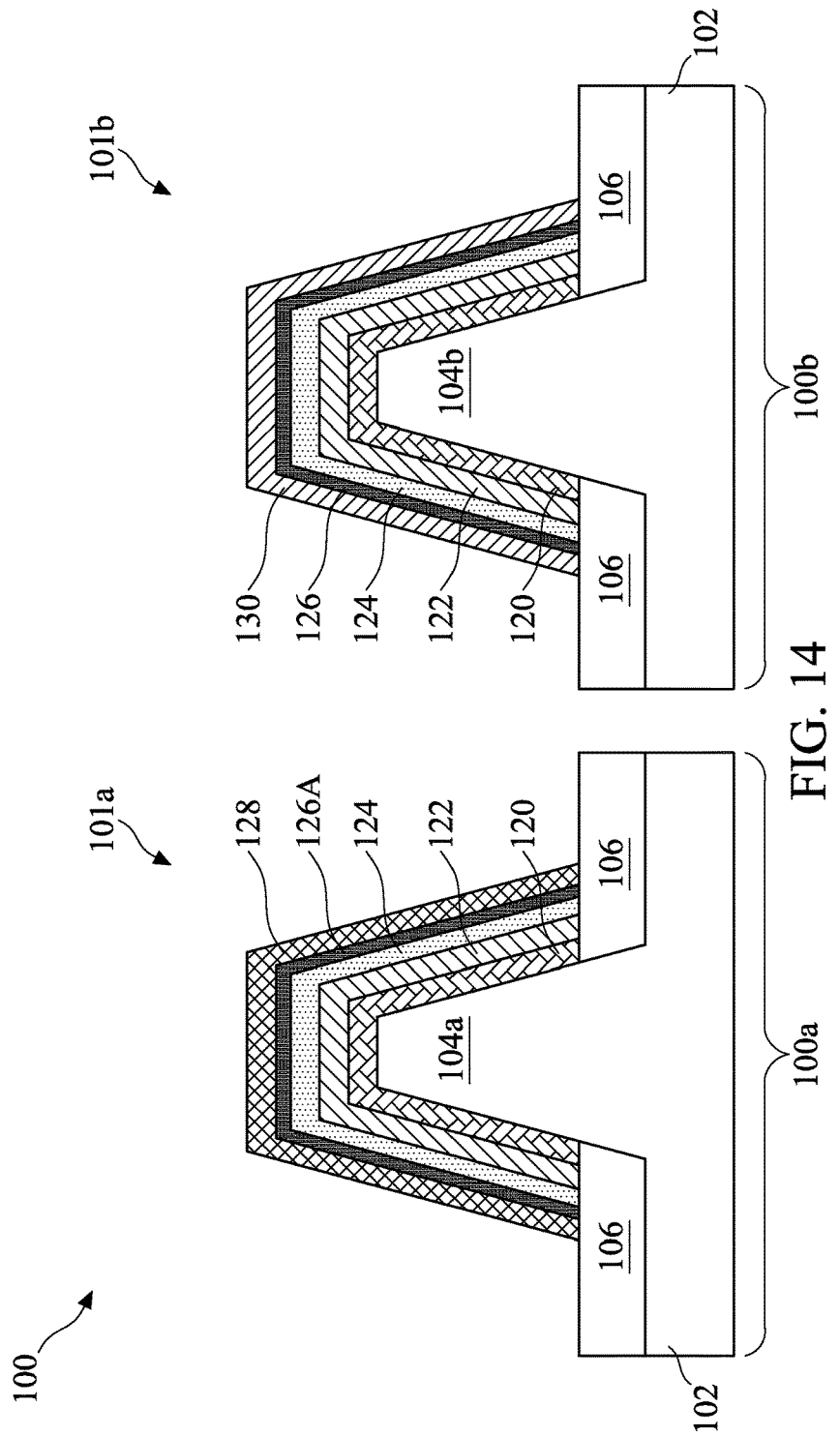
Figure 15:
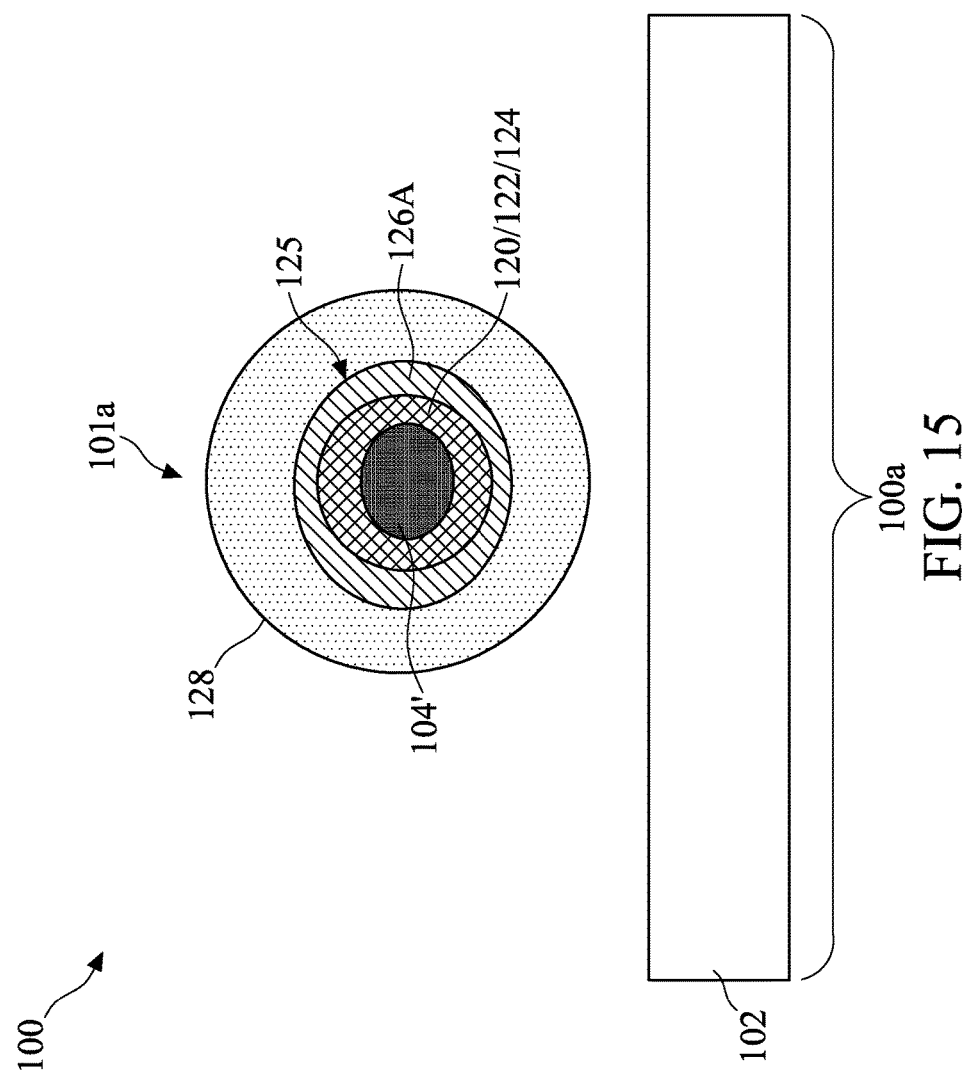

At operation 202, the method 200 (FIG. 2A) receives a device structure 100 (or simply, device 100) having a substrate 102 with various structures formed therein and/or thereon. Referring to FIG. 3, the device 100 includes the substrate 102 and isolation structures 106 over the substrate 102. The isolation structures 106 separate the device 100 into various device regions. In the example as shown, there is an n-FET device region 100a for forming NFETs and a p-FET device region 100b for forming PFETs. In the present embodiment, the device 100 includes FinFETs and the substrate 102 includes two active fins 104a and 104b that project upwardly through the isolation structures 106. The two fins 104a and 104b are in the device regions 100a and 100b respectively. To further this embodiment, FIGS. 3-13 are schematic cross-sectional views of portions of the device 100 along a fin length direction of the respective fins 104a and 104b, while FIG. 14 is a schematic cross-sectional view of portions of the device 100 along a fin width direction of the respective fins 104a and 104b. In various embodiments, the device regions 100a and 100b can be contiguous or non-contiguous, and each may be processed to have more than one transistor. The present disclosure is not limited to any particular number of devices or device regions, or to any particular device configurations. Further, even though FinFETs are used as examples, the device 100 may alternatively or additionally include 2-D transistors (or planar transistors), in which case FIGS. 3-13 are schematic cross-sectional views of portions of the 2-D transistors along a channel length direction thereof and FIG. 14 is not applicable to the 2-D transistors. Still further, FIG. 15 illustrates an embodiment of the device 100 having a nanowire channel wrapped around by a high-k metal gate constructed according to the present disclosure, in which case the device 100 includes gate-all-around transistors.

The device 100 further includes gate structures 101a and 101b in the device regions 100a and 100b respectively. The gate structures 101a and 101b each include a temporary (or dummy) gate stack 110 and a spacer feature (or gate spacer) 112 on sidewalls of the temporary gate stack 110. The temporary gate stack 110 will be replaced by a high-k metal gate in later fabrication steps. The gate structures 101a and 101b each engage a portion of the active fins 104a and 104b respectively. The device 100 further includes source/drain (S/D) regions (or S/D features) 108a and 108b at least partially embedded in the respective actin fins 104a and 104b, and disposed on opposite sides of the respective gate structures 101a and 101b. The S/D features 108a and 108b may be raised above the isolation structures 106 in some embodiments. The device 100 further includes an inter-layer dielectric (ILD) layer 114 surrounding the gate structures 101a and 101b. The various aforementioned structures of the device 100 will be further described below.

The substrate 102 is a silicon substrate in the present embodiment. Alternatively, the substrate 102 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 102 is a semiconductor-on-insulator (SOI) such as having a buried dielectric layer.

In the present embodiment, the fin 104a is suitable for forming n-type FinFET(s), and the fin 104b is suitable for forming p-type FinFET(s). This configuration is for illustrative purposes only and does not limit the present disclosure. The fins 104a and 104b may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins 104a and 104b by etching initial epitaxial semiconductor layers of the substrate 102. The etching process can include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant.

The isolation structures 106 may include silicon oxide, silicon nitride, silicon oxynitride, fluoride-doped silicate glass (FSG), a low-k dielectric material, and/or other suitable insulating material. The isolation structures 106 may be shallow trench isolation (STI) features. In an embodiment, the isolation structures 106 are formed by etching trenches in the substrate 102, e.g., as part of the fins 104a/b formation process. The trenches may then be filled with isolating material, followed by a chemical mechanical planarization (CMP) process and/or an etch-back process. Other isolation structure such as field oxide, LOCal Oxidation of Silicon (LOCOS), and/or other suitable structures are possible. The isolation structure 106 may include a multi-layer structure, for example, having one or more thermal oxide liner layers.

The temporary gate stacks 110 engage the fins 104a and 104b on two or three sides of the fins in the present embodiment. The temporary gate stacks 110 may include one or more material layers, such as an oxide layer, a polysilicon layer, a hard mask layer, and other suitable layers. The various layers in the temporary gate stacks 110 may be formed by suitable deposition techniques. For example, the oxide layer may be formed by chemical oxidation, thermal oxidation, ALD, CVD, and/or other suitable methods. For example, the polysilicon layer may be formed by suitable deposition processes such as low-pressure chemical vapor deposition (LPCVD) and plasma-enhanced CVD (PECVD). In an embodiment, the temporary gate stacks 110 are first deposited as blanket layers. Then the blanket layers are patterned through a process including photolithography processes and etching processes thereby removing portions of the blanket layers and keeping the remaining portions over the isolation structure 106 and the fins 104a/b as the temporary gate stacks 110.

The spacer feature 112 is formed on sidewalls of the temporary gate stack 110. The spacer feature 112 includes a material different from the material(s) for the temporary gate stack 110. In an embodiment, the spacer feature 112 includes a dielectric material, such as silicon nitride or silicon oxynitride. In an example, the spacer feature 112 includes multiple layers, such as a seal layer adjacent to the temporary gate stacks 110 and a main spacer layer adjacent to the seal layer. In an embodiment, after the temporary gate stacks 110 have been formed, one or more spacer layers are formed by blanket depositing spacer materials over the device 100. Then, an anisotropic etching process is performed to remove portions of the spacer layers to form the spacer feature 112 as illustrated in FIG. 3.

The S/D features 108a and 108b may be formed by various techniques, such as etching processes followed by one or more epitaxy processes. In one example, one or more etching processes are performed to remove portions of the fins 104a and 104b to form recesses therein. A cleaning process may be performed that cleans the recesses with a hydrofluoric acid (HF) solution or other suitable solution. Subsequently, one or more epitaxial growth processes are performed to grow semiconductor features (e.g., silicon for NFET and silicon-germanium for PFET) in the recesses. The epitaxial growth process may in-situ or ex-situ dope the grown semiconductor with a p-type dopant for forming a p-type FinFET or an n-type dopant for forming an n-type FinFET.

The ILD layer 114 is formed over the substrate 102. In embodiments, the device 100 further includes a contact etch stop layer (e.g., a silicon nitride layer) underneath the ILD layer 114. The ILD layer 114 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 114 may be deposited by a PECVD process or a flowable CVD (FCVD) process. After various deposition processes, a chemical mechanical planarization (CMP) process is performed to planarize a top surface of the dielectric layer 114 and to expose a top surface of the temporary gate stacks 110 for subsequent fabrication steps.

Figure 4:
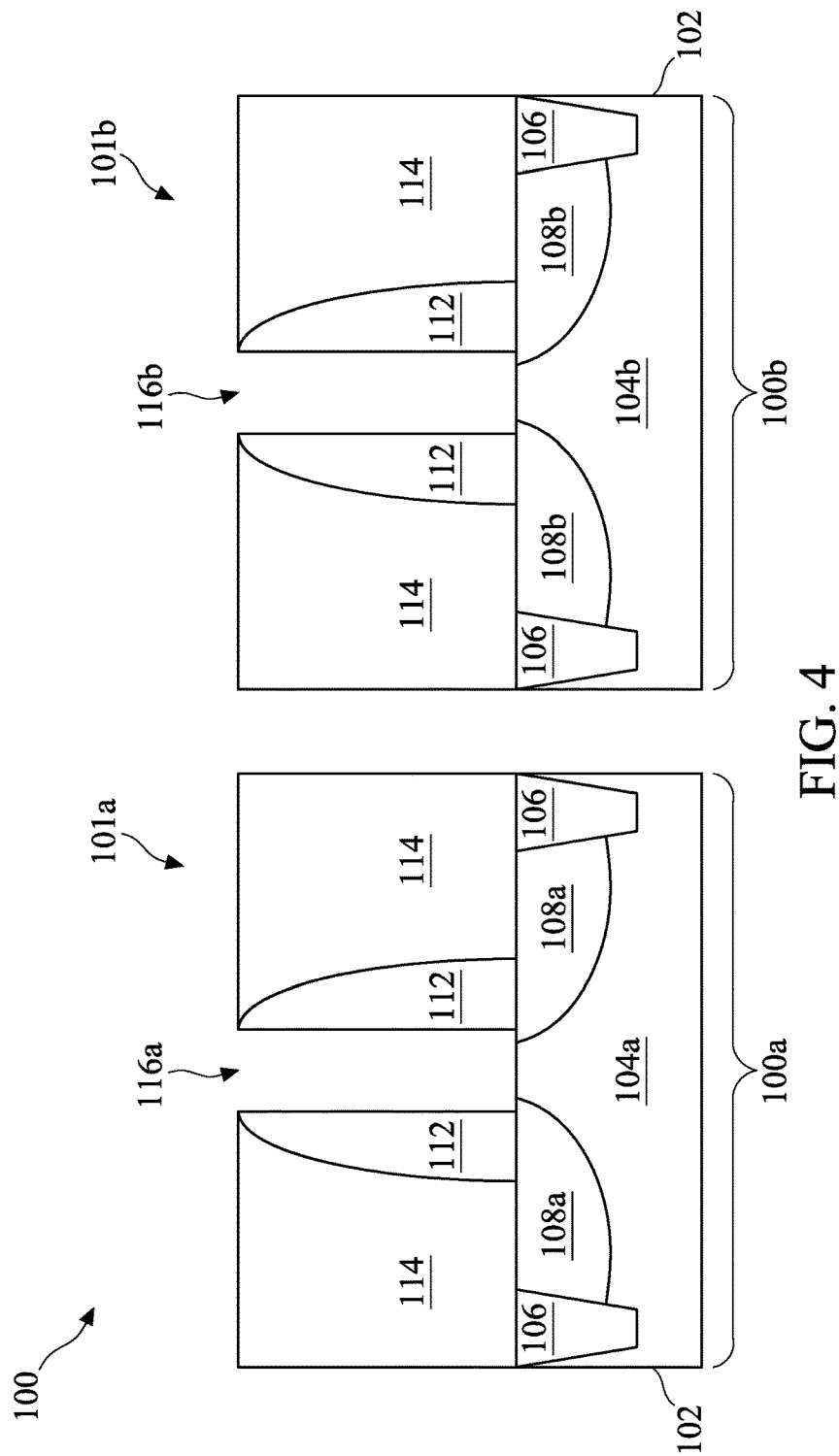

At operation 204, the method 200 (FIG. 2A) removes the temporary gate stacks 110. Referring to FIG. 4, two gate trenches 116a and 116b are thereby formed in the gate structures 101a and 101b respectively, exposing the fins 104a and 104b there through. The trenches 116a and 116b are surrounded by structures discussed above, such as the spacer feature 112 and the ILD layer 114. In an embodiment, the operation 204 includes one or more etching processes that are selectively tuned to remove the temporary gate stacks 110 (FIG. 3) while the spacer feature 112 and the ILD layer 114 substantially remain. The etching processes may include a suitable wet etch, dry (plasma) etch, and/or other processes. For example, a dry etching process may use chlorine-containing gases, fluorine-containing gases, other etching gases, or a combination thereof. The wet etching solutions may include NH₄OH, HF (hydrofluoric acid) or diluted HF, deionized water, TMAH (tetramethylammonium hydroxide), other suitable wet etching solutions, or combinations thereof.

Figure 5:
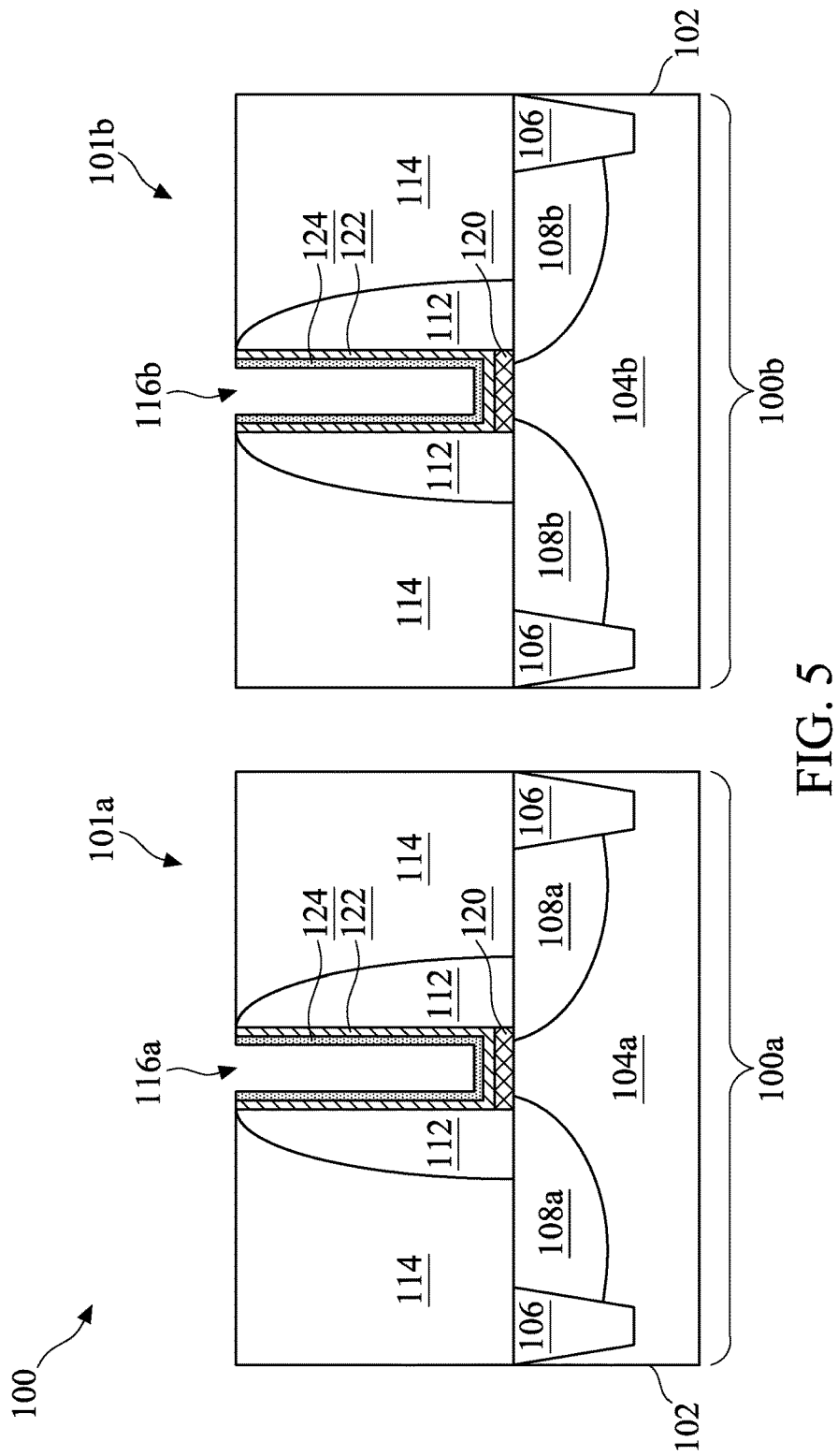

At operation 206, the method 200 (FIG. 2A) forms an interfacial layer 120 in the trenches 116a and 116b. At operation 208, the method 200 (FIG. 2A) forms a gate dielectric layer 122 in the trenches 116a and 116b and over the interfacial layer 120. At operation 210, the method 200 (FIG. 2A) forms a capping layer 124 in the trenches 116a and 116b and over the gate dielectric layer 122. After the operations 206, 208, and 210, the resulting device 100 is shown in FIG. 5. The interfacial layer 120 may include $SiO_2$, SiON, or other suitable dielectric materials and may be formed by chemical oxidation, thermal oxidation, ALD, and/or other suitable methods. In the present embodiment, the gate dielectric layer 122 includes a high-k dielectric material such as $HfO_2$, $Al_2O_3$, $TiO_2$, $La_2O_3$, $HfSiO_4$, $ZrO_2$, $Y_2O_3$, $SrTiO_3$, combinations thereof, or other suitable material. The gate dielectric layer 122 may be formed by ALD and/or other suitable methods. The capping layer 124 may include a lanthanum-based oxide, $SiO_2$, $Y_2O_3$, TiN, TiSiN, TaN, a combination thereof, or other suitable capping layer; and may be formed by ALD and/or other suitable methods. The capping layer 124 is designed to protect the gate dielectric layer 122 from metal impurities that may be diffused from other layers above or over the capping layer 124.

Figure 6:
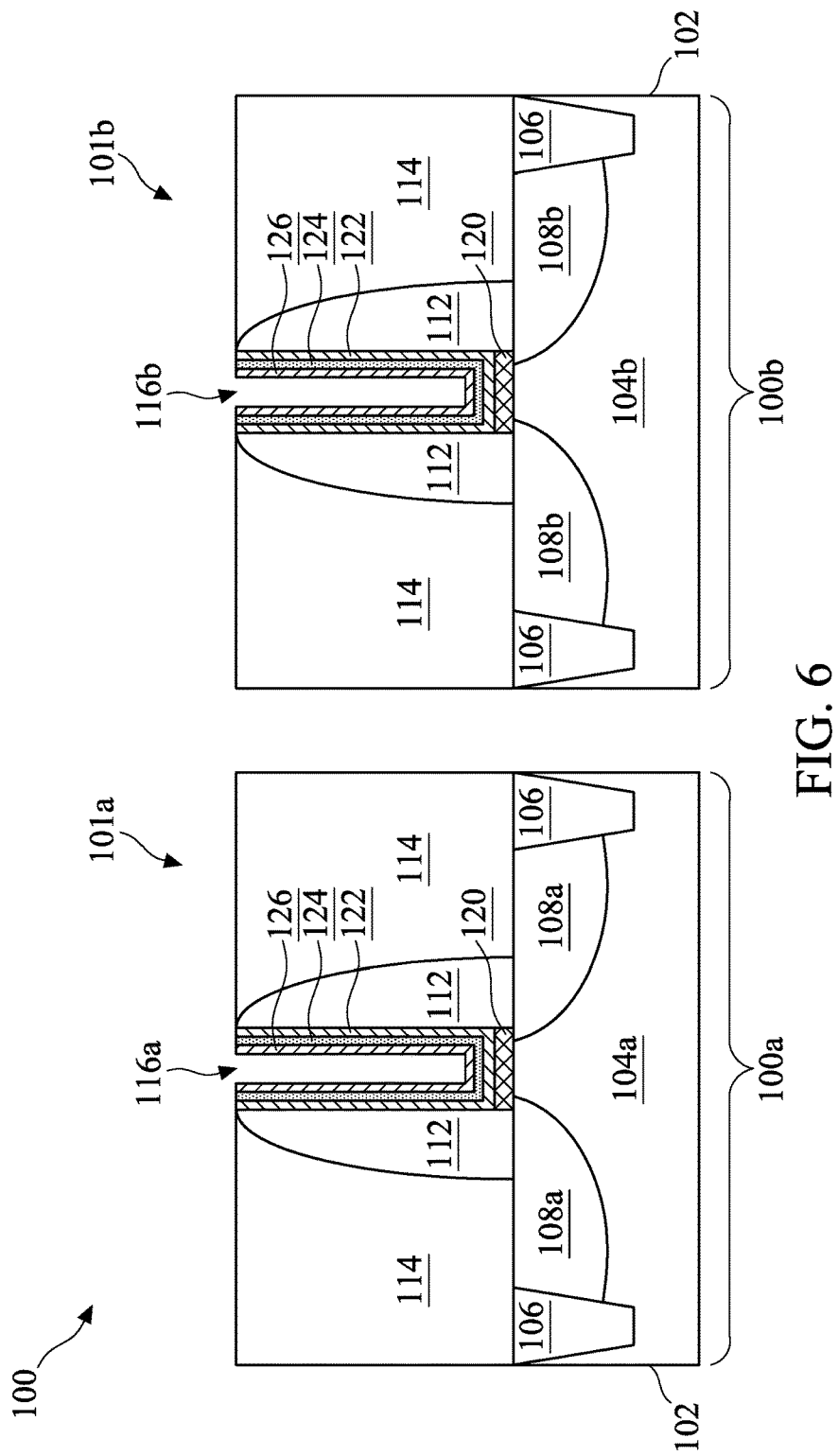

At operation 212, the method 200 (FIG. 2A) forms a barrier layer 126 in the trenches 116a and 116b and over the capping layer 124. Referring to FIG. 6, the barrier layer 126 includes a metal nitride in the present embodiment. For example, the barrier layer 126 may include tantalum nitride, titanium nitride, niobium nitride, or a combination thereof. Various other materials are possible. In an embodiment, the barrier layer 126 is formed by ALD, PVD, CVD, or other suitable methods. In the present embodiment, the barrier layer 126 has a thickness about 10 to 20 Å. One purpose of the barrier layer 126 is to protect the capping layer 124 from various etching processes during work function metal layer patterning for threshold voltage tuning. For example, a p-type work function metal may be simultaneously deposited into the trenches 116a and 116b, and then its portion in the trench 116a is replaced with an n-type work function metal in order to form an NFET in the device region 100a. The opposite can also be done, i.e., depositing an n-type work function metal into both the trenches and then replacing it with a p-type work function metal in the trench 116b. In either case, without the barrier layer 126, the capping layer 124 might be undesirably etched during the metal patterning/removal processes, due in part to poor etch selectivity of the etchant used for the patterning/removing of the metal layers. If the capping layer 124 is compromised, the gate dielectric layer 122 would be compromised as well. Therefore, it is desirable to have the barrier layer 126 for protecting the capping layer 124. However, having the barrier layer 126 also increases the distance between the gate dielectric layer 122 and the work function metal layer to be deposited over the barrier layer 126, which undesirably increases the work function for NFET. The present disclosure aims to reduce this effect while still having the barrier layer 126 as an etch protection layer for the capping layer 124.

Figure 7:
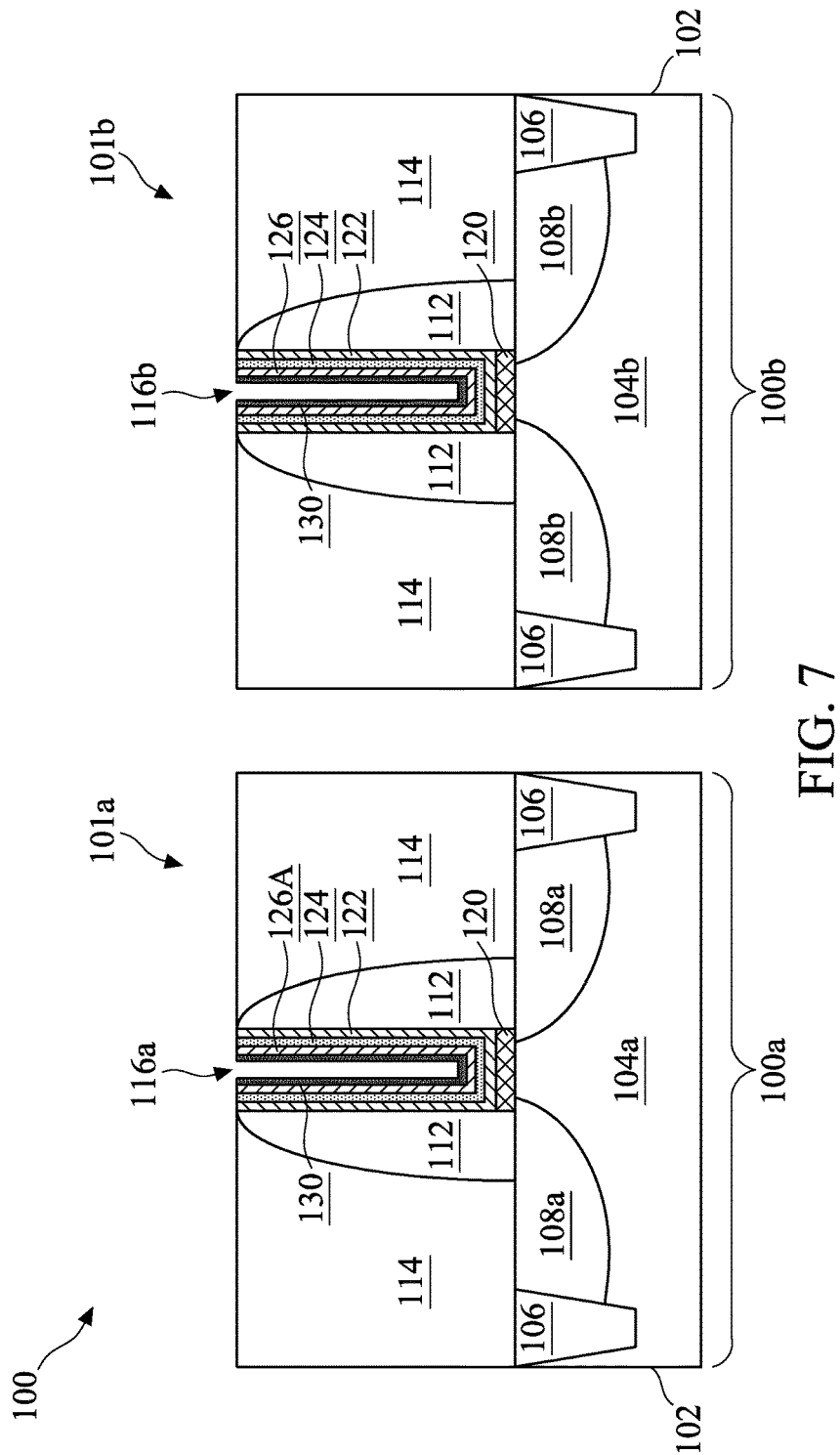

At operation 214, the method 200 (FIG. 2A) deposits a p-type work function metal layer 130 into the trenches 116a and 116b, as shown in FIG. 7. The p-type work function metal layer 130 comprises a metal with a sufficiently large effective work function, selected from but not restricted to the group of titanium nitride (TiN), tantalum nitride (TaN), ruthenium (Ru), molybdenum (Mo), tungsten (W), platinum (Pt), or combinations thereof. The p-type work function metal layer 130 may include one or more layers of materials. The p-type work function metal layer 130 may be deposited by CVD, PVD, ALD, and/or other suitable process.

Figure 8:
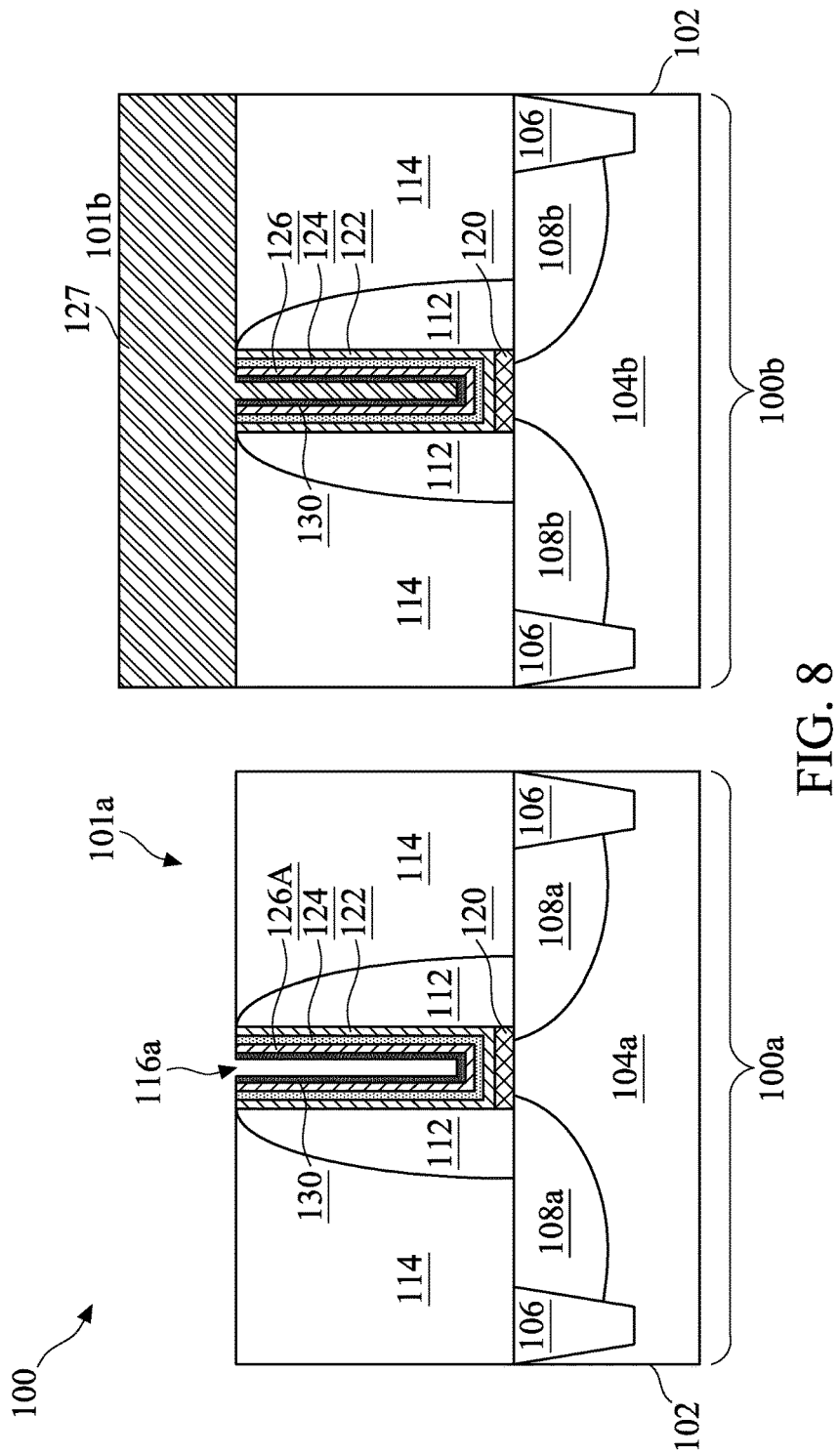

At operation 216, the method 200 (FIG. 2B) forms a patterned mask 127 covering the PFET region 100b. Referring to FIG. 8, in an embodiment, the patterned mask 127 includes a resist (or photoresist) patterned with a photolithography process and may further include a resist underlayer such as a bottom anti-reflective coating (BARC). The photolithography process may include forming a resist layer overlying the substrate 102, exposing the resist to a pattern, performing post-exposure bake processes, and developing the resist to remove its portion over the device region 100a and to form the patterned mask 127.

Figure 9:
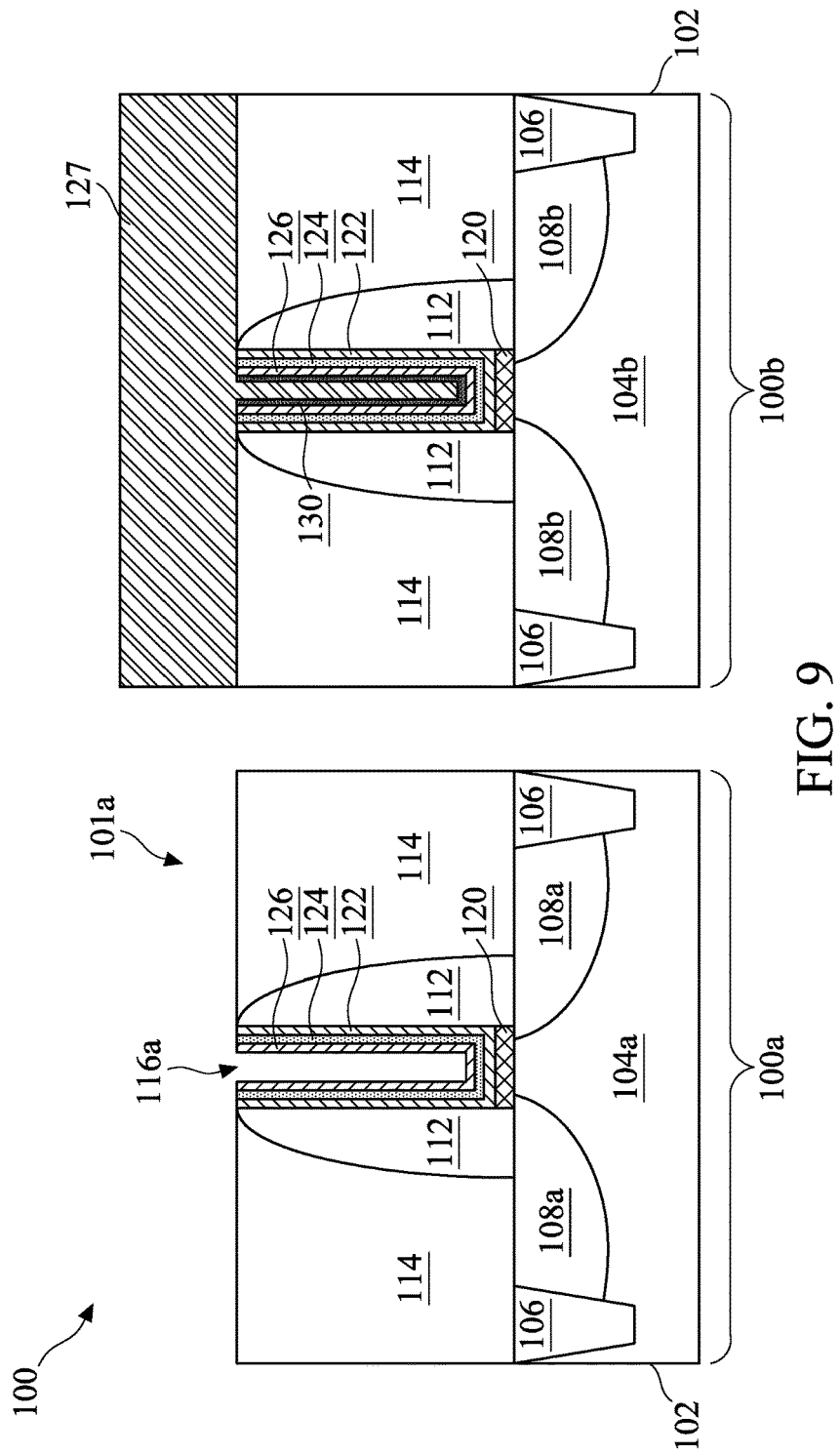

At operation 218, the method 200 (FIG. 2B) removes the p-type work function metal layer 130 from the first trench 116a by one or more etching processes, such as wet etching, dry etching, reactive ion etching, and/or atomic layer etching. In an embodiment, the etching process applies an etchant having a phosphoric acid to the p-type work function metal layer 130. Additionally or alternatively, the etchant may include other components such as hydrogen peroxide ($H_2O_2$), Nitric acid ($HNO_3$), Sulfuric acid ($H_2SO_4$), deionized water (DIW), ammonium hydroxide ($NH_4OH$), ozone ($O_3$), hydrofluoric acid (HF), hydrochloric acid (HCl), other acidic solutions and organic oxidizer, or a combination thereof. The etching processes are designed to be selective to the p-type work function metal layer 130 and do not (or insignificantly) etch the barrier layer 126. The barrier layer 126 in the trench 116a effectively protects the capping layer 124 from the etching processes. In other words, the etching of the p-type work function metal layer 130 in the trench 116a stops at the barrier layer 126. After the operation 218, the p-type work function metal layer 130 is removed from the trench 116a but remains in the trench 116b, as shown in FIG. 9. During this etching process, the patterned mask 127 protects the structures in the PFET region 100b.

Figure 10:
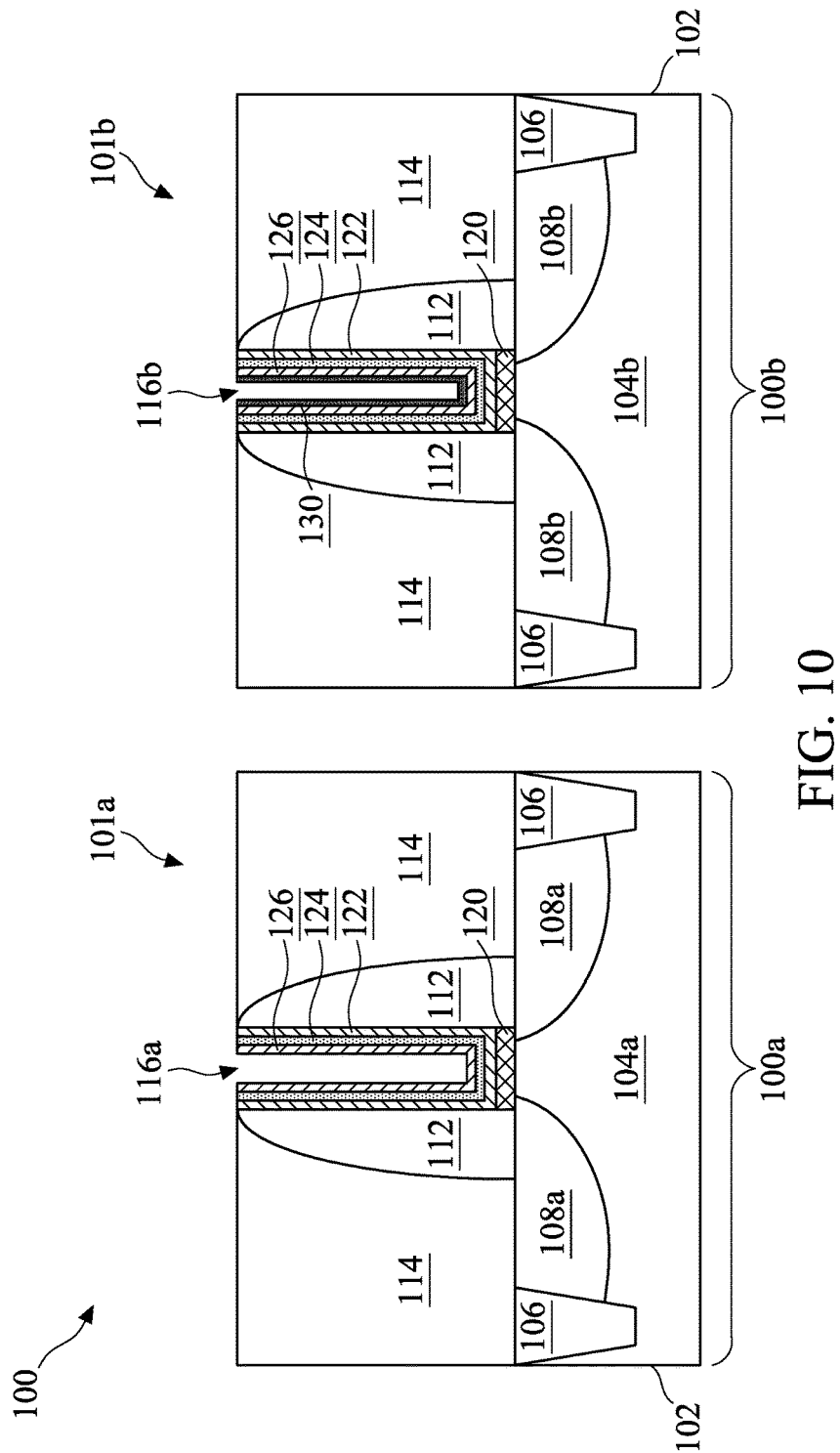

At operation 220, the method 200 (FIG. 2B) removes the patterned mask 127 from the device region 100b using a process such as resist stripping or ashing. The resulting structure is shown in FIG. 10.

Figure 11:
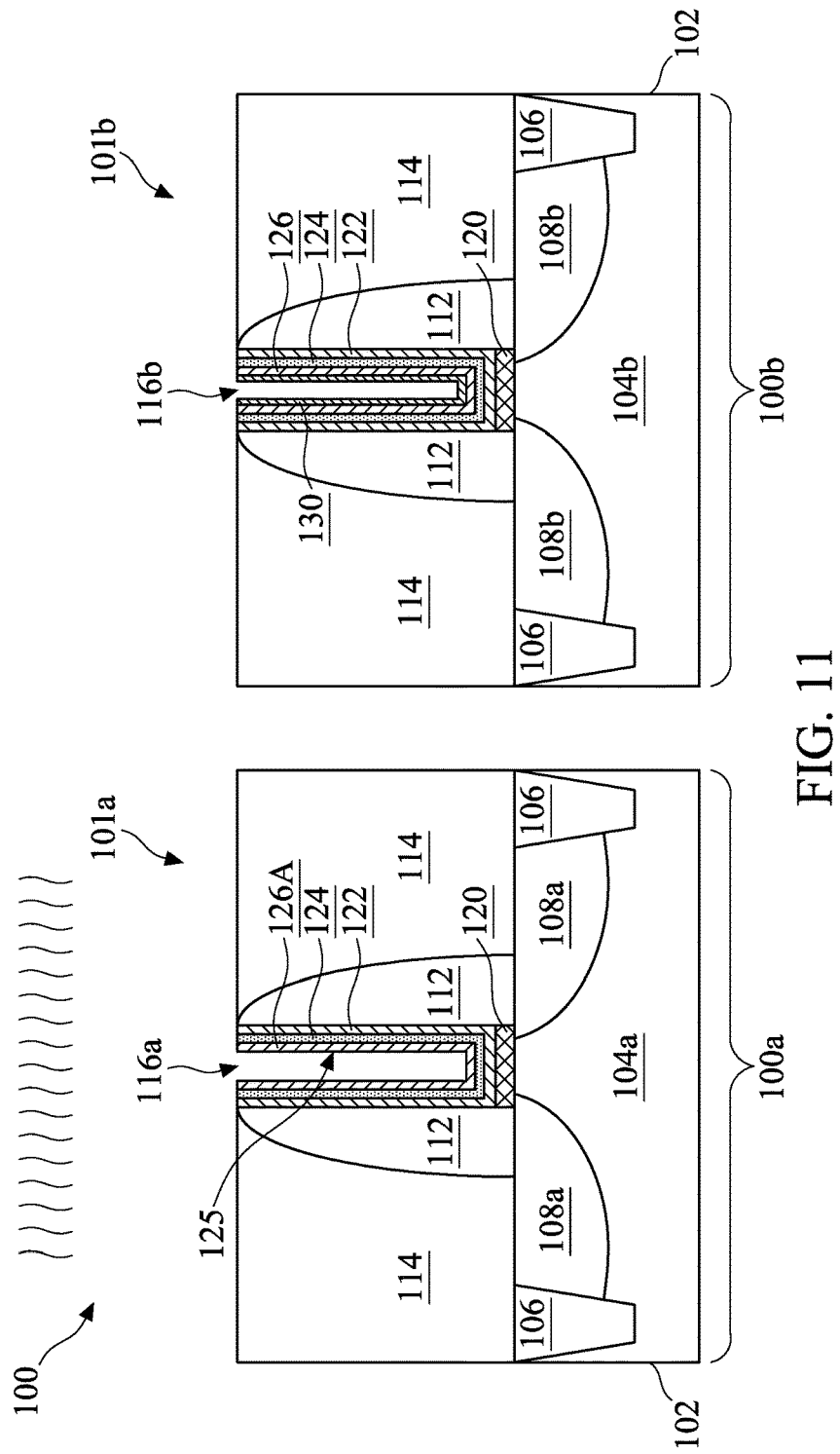

At operation 222, the method 200 (FIG. 2B) treats the barrier layer 126 in the trench 116a to roughen the surface 125 of the barrier layer 126 (FIG. 11). The treated barrier layer 126 is referred to as 126A to differentiate it from the untreated barrier layer 126 in the PFET region 100b. In an embodiment, the operation 222 applies a chlorine-containing gas (e.g., a metal chloride gas) to the barrier layer 126. The chlorine-containing gas may be diluted with argon gas in some embodiments. In the present embodiment, a surface portion of the barrier layer 126 includes an oxide (oxidized portion of the barrier layer 126A), for example, resulted from being exposed to the atmosphere after the barrier layer 126 is deposited in the operation 212. For example, if the barrier layer 126 contains tantalum nitride (TaN), then there is some tantalum oxide ($Ta_2O_5$) in the surface of the barrier layer 126A. The chlorine-containing gas reacts with the oxide, resulting in the roughened surface 125. In an embodiment, the treatment is performed at a temperature of about 400 to 500° C. This temperature range is selected to increase reaction speed while keeping the integrity of various structures (e.g., the S/D features 108a/b, the high-k gate dielectric layer 122, etc.) of the device 100. If the temperature is too high, some existing structures of the device 100 might be damaged. If the temperature is too low, the process may take undesirably long time. In a further embodiment, the treatment is performed at a pressure of about 10 to 35 Torr, which is tuned for the desired roughness in the surface 125.

In one example, the chlorine-containing gas includes titanium chloride ($TiCl_5$), tantalum chloride ($TaCl_5$), tungsten chloride ($WCl_5$), or a mixture thereof. In another example, the chlorine-containing gas may include a tungsten chloride ($WCl_x$) such as $WCl_2$, $WCl_3$, $WCl_4$, $WCl_5$, $WCl_6$, or a mixture thereof. For example, $WCl_5$ gas can react with $Ta_2O_5$ solid to produce $WOCl_y$ gas and $TaCl_x$ solid. The $WOCl_y$ gas may then be extracted out of the reaction chamber. By such substitution reaction, the oxidized portions of the barrier layer 126A may be partially or completely removed, resulting in the rough surface 125. In an embodiment, the thickness of the barrier layer 126A may vary from 5 to 18 Å across the entire layer and the surface 125 has an average surface roughness (Ra) of 3 to 10 Angstroms (Å), where Ra is the arithmetic average of the roughness profile of the surface 125. In various embodiments, the temperature and pressure of the treatment process can be tuned to achieve a desired surface roughness on the surface 125. In some embodiments, the barrier layer 126A becomes about 10 Å thinner than the barrier layer 126 due to the treatment. For example, the barrier layer 126 is about 15 to 20 Å thick, and the treated barrier layer 126A is about 5 to 10 Å thick. The thickness of the treated barrier layer 126A is related to how much metal diffusion (e.g., Al diffusion) from n-type work function metal layer (e.g., n-type work function metal layer 128 of FIG. 1) through the barrier layer 126A is desired. The thickness and roughness of the barrier layer 126A can be designed and tuned to meet device work function requirements.

In the present embodiment, the operation 222 also treats the p-type work function metal layer 130 in the trench 116b while treating the barrier layer 126. The various treatment processes and chemicals are selected to work with the material(s) of the p-type work function metal layer 130 so as not to degrade the p-type work function metal layer 130.

Figure 12:
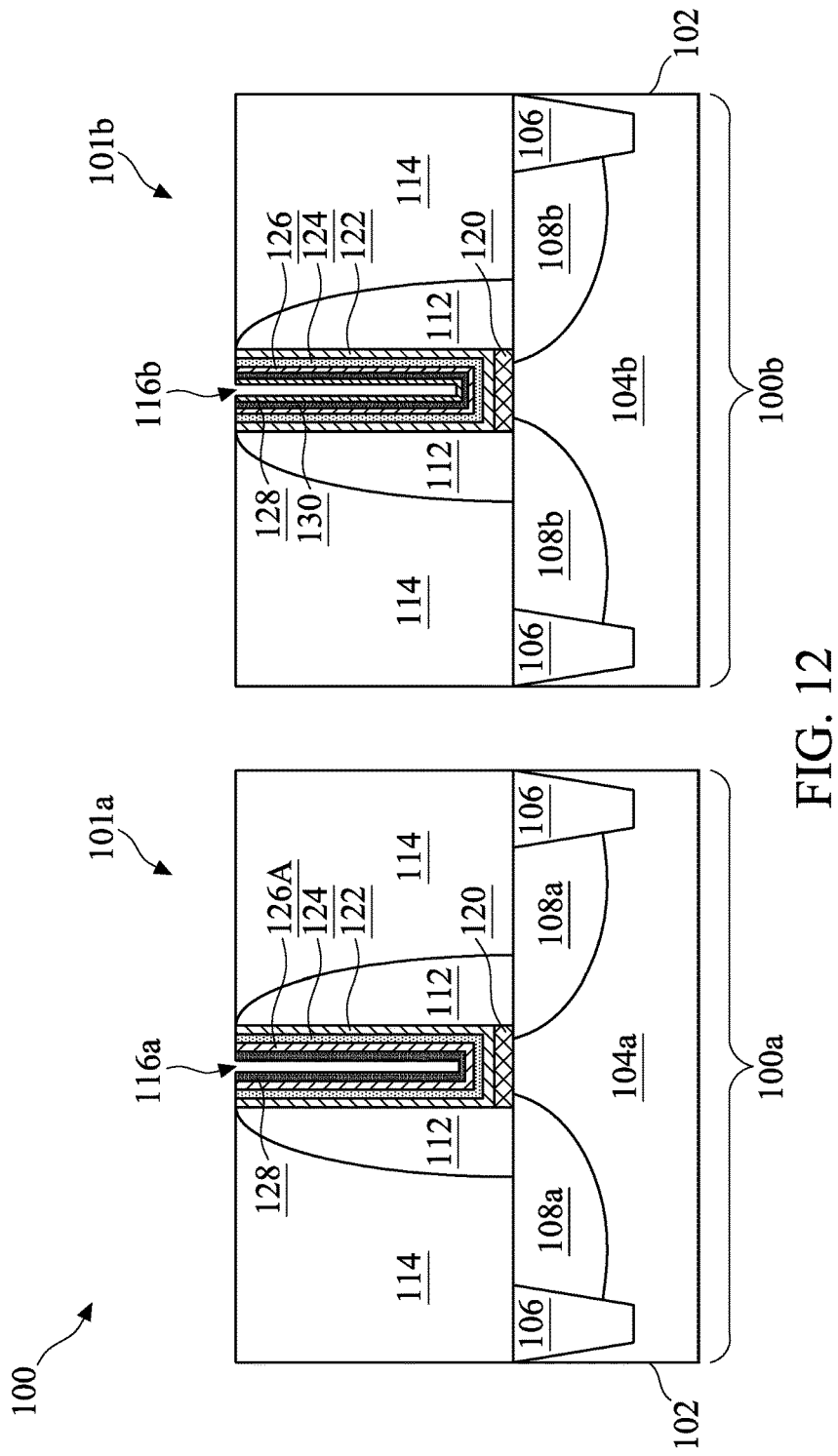

At operation 224, the method 200 (FIG. 2B) deposits an n-type work function metal layer 128 in the trenches 116a and 116b, such as shown in FIG. 12. Particularly, the n-type work function metal layer 128 is deposited over the treated barrier layer 126A in the trench 116a, and deposited over the p-type work function metal layer 130 in the trench 116b. In the present embodiment, the operations 222 and 224 are performed without breaking vacuum there between, for example, in the same process chamber or in the same cluster tool. The n-type work function metal layer 128 includes one or more materials suitable for forming an NFET in the device region 100a. For example, the n-type work function metal layer 128 may comprise a metal with sufficiently low effective work function, selected from but not restricted to the group of Ti, Al, Zr, Ta, Nb, TiAl, TaC, TaCN, TaSiN, TiSiN, TiAlC, TiAlN, or combinations thereof. In one example, the work function metal layer 128 has a thickness of about 10 to about 50 Å. The n-type work function metal layer 128 may be formed by PVD, CVD, ALD and/or other suitable methods. Particularly in the present embodiment, the n-type work function metal layer 128 includes Al in its portion close to and in direct contact with the surface 125. Due to the roughened surface 125, portions of the barrier layer 126A are thin enough for aluminum atoms to diffuse through.

Experiments have shown that oxygen concentration (or content) gradually decreases from the capping layer 124 to the barrier layer 126A and from the barrier layer 126A to the n-type work function metal layer 128. At the same time, aluminum concentration is the highest at the lower portion (closest to the barrier layer 126A) of the n-type work function metal layer 128, followed by the barrier layer 126A and the upper portion (further away from the barrier layer 126A) of the n-type work function metal layer 128, followed by the interface between the barrier layer 126A and the capping layer 124, and followed by the capping layer 124. The aluminum concentration decreases in the order discussed above in the present embodiment. The distribution of the aluminum atoms in the various layers 128, 126A, and 124 confirms that the aluminum atoms have diffused through the roughened barrier layer 126A. Having aluminum atoms closer to the high-k dielectric layer 122 helps lower the work function of the high-k metal gate 101a. In various embodiments, other types of n-type work function metal atoms such as Ti and Zr may also diffuse through the roughened barrier layer 126A and move closer to the high-k dielectric layer 122, which helps lower the work function of the high-k metal gate 101a.

At operation 226, the method 200 (FIG. 2B) performs further steps to the device 100. For example, the operation 226 may deposit a metal blocking layer 132 and a metal fill layer 134 into the trenches 116a and 116b, such as shown in FIG. 13. The blocking layer 132 may include titanium nitride, titanium aluminum oxide, or other suitable materials; and may be deposited by PVD, CVD, ALD and/or other suitable methods. The metal fill layer 134 may include aluminum (Al), tungsten (W), cobalt (Co), copper (Cu), and/or other suitable materials; and may be deposited using methods such as CVD, PVD, plating, and/or other suitable processes. The operation 226 may perform a chemical mechanical planarization (CMP) process to remove excessive materials from the gate structures 101a/b. The operation 226 may further form contacts and vias electrically connecting the source/drain features 108a/b and the gate structures 101a/b and form metal interconnects connecting the FinFETs to other portions of the device 100 to form a complete IC.

FIG. 14 illustrates a cross-sectional view (along the fin width direction) of a portion of the device 100, in accordance with an embodiment. Not all features of the device 100 are shown in FIG. 14. Referring to FIG. 14, in the NFET region 100a, the device 100 includes the substrate 102, the isolation structures 106, the fin 104a, and the n-type high-k metal gate stack 101a. In the PFET region 100b, the device 100 includes the substrate 102, the isolation structures 106, the fin 104b, and the p-type high-k metal gate stack 101b. Each of the gate stacks 101a and 101b includes the interfacial layer 120 on surfaces of the respective fin 104a/b, the capping layer 122, and the high-k gate dielectric layer 124. The n-type high-k metal gate stack 101a further includes the roughened barrier layer 126A over the capping layer 124, and the n-type work function metal layer 128 over the roughened barrier layer 126A. The p-type high-k metal gate stack 101b further includes the barrier layer 126 over the capping layer 124, and the p-type work function metal layer 130 over the barrier layer 126.

FIG. 15 illustrates an embodiment of the device 100 where a transistor channel 104' is a nanowire instead of a fin. At least the layers 120, 122, 124, and 126A of the high-k metal gate stack 101a wrap around the transistor channel 104'. The barrier layer 126A has a roughened outer surface 125. The n-type work function metal layer 128 is disposed around the roughened outer surface 125, which helps some metal atoms (such as aluminum atoms) of the n-type work function metal layer 128 diffuse through the barrier layer 126A.

Although not intended to be limiting, one or more embodiments of the present disclosure provide many benefits to a semiconductor device and the formation thereof. For example, embodiments of the present disclosure provide a novel high-k metal gate stack for NFET, where the high-k metal gate stack includes a roughened barrier layer between an n-type work function metal layer and the high-k dielectric layer. The roughened barrier layer helps bring n-type metal atoms such as aluminum atoms closer to the high-k dielectric layer, thereby reducing the work function of the high-k metal gate. Methods of forming the same can be readily integrated into existing semiconductor manufacturing processes.

In one exemplary aspect, the present disclosure is directed to a method of forming a semiconductor device. The method includes receiving a structure having a substrate, a gate trench over the substrate, and a dielectric layer over the substrate and surrounding the gate trench. The method further includes forming a gate dielectric layer in the gate trench, forming a barrier layer in the gate trench and over the gate dielectric layer, and treating the barrier layer to roughen an outer surface of the barrier layer, resulting in a treated barrier layer. The method further includes forming an n-type work function metal layer over the treated barrier layer.

In an embodiment of the method, the n-type work function metal layer includes aluminum (Al). In a further embodiment, the barrier layer includes tantalum nitride (TaN) or titanium nitride (TiN). In a further embodiment, the treating of the barrier layer includes applying a chlorine-containing gas to the barrier layer. In one example, the chlorine-containing gas includes tungsten chloride ($WCl_x$).

In an embodiment of the method, the outer surface of the barrier layer is roughened to have an average surface roughness (Ra) of 3 to 10 angstroms. In another embodiment of the method, the treating of the barrier layer is performed at a temperature ranging from 400 to 500 degrees Celsius and a pressure ranging from 10 to 35 Torr. In yet another embodiment, the method further includes forming a capping layer between the gate dielectric layer and the barrier layer.

In another exemplary aspect, the present disclosure is directed to a method of forming a semiconductor device. The method includes receiving a structure having a substrate, first and second gate trenches over the substrate, and a dielectric layer over the substrate and surrounding the first and second gate trenches. The method further includes forming a gate dielectric layer in the first and second gate trenches, and forming a barrier layer in the first and second gate trenches and over the gate dielectric layer. The method further includes depositing a p-type work function metal layer in the first and second gate trenches and over the barrier layer; forming a patterned mask covering the second gate trench; and removing the p-type work function metal layer from the first gate trench, thereby exposing the barrier layer in the first gate trench. The method further includes removing the patterned mask after the removing of the p-type work function metal layer from the first gate trench; and treating the barrier layer in the first gate trench to roughen an outer surface of the barrier layer. The method further includes, after the treating of the barrier layer, depositing an n-type work function metal layer in the first and second gate trenches.

In an embodiment of the method, the treating of the barrier layer and the depositing of the n-type work function metal layer are performed without breaking vacuum. In another embodiment, the method further includes forming a capping layer over the gate dielectric layer before the forming of the barrier layer.

In an embodiment of the method, the gate dielectric layer includes a high-k dielectric material, the barrier layer includes a metal nitride, and the n-type work function metal layer includes aluminum.

In another embodiment, the method further includes depositing a metal blocking layer over the n-type work function metal layer in the first and second gate trenches.

In an embodiment of the method, the treating of the barrier layer includes applying a metal chloride gas to the barrier layer in the first gate trench. In a further embodiment, the metal chloride gas includes a tungsten chloride.

In another exemplary aspect, the present disclosure is directed to a semiconductor structure. The semiconductor structure includes a substrate, a gate stack over the substrate, and source and drain features adjacent to the gate stack. The gate stack includes a high-k dielectric layer, a barrier layer over the high-k dielectric layer, the barrier layer having a roughened surface, and an n-type work function metal layer over the roughened surface.

In an embodiment of the semiconductor structure, the roughened surface has an average surface roughness of 3 to 10 angstroms. In an embodiment, the semiconductor structure further includes a capping layer between the high-k dielectric layer and the barrier layer. In a further embodiment, each of the n-type work function metal layer and the barrier layer includes aluminum, and the gate stack also includes aluminum between the barrier layer and the capping layer. In another embodiment of the semiconductor structure, the n-type work function metal layer includes aluminum and titanium, the barrier layer includes aluminum and one of titanium nitride and tantalum nitride, and the gate stack further includes aluminum between the barrier layer and the high-k dielectric layer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
   receiving a structure having a substrate, a gate trench over the substrate, and a dielectric layer over the substrate and surrounding the gate trench;
   forming a gate dielectric layer in the gate trench;
   forming a barrier layer in the gate trench and over the gate dielectric layer;

treating the barrier layer to roughen an outer surface of the barrier layer, resulting in a treated barrier layer; and forming an n-type work function metal layer over the treated barrier layer.

2. The method of claim 1, wherein the n-type work function metal layer includes aluminum (Al).

3. The method of claim 2, wherein the barrier layer includes tantalum nitride (TaN) or titanium nitride (TiN).

4. The method of claim 3, wherein the treating of the barrier layer includes applying a chlorine-containing gas to the barrier layer.

5. The method of claim 4, wherein the chlorine-containing gas includes tungsten chloride ($WCl_x$).

6. The method of claim 1, wherein the outer surface of the barrier layer is roughened to have an average surface roughness (Ra) of 3 to 10 angstroms.

7. The method of claim 1, wherein the treating of the barrier layer is performed at a temperature ranging from 400 to 500 degrees Celsius and a pressure ranging from 10 to 35 Torr.

8. The method of claim 1, further comprising:
forming a capping layer between the gate dielectric layer and the barrier layer.

9. A method of forming a semiconductor device, comprising:
receiving a structure having a substrate, first and second gate trenches over the substrate, and a dielectric layer over the substrate and surrounding the first and second gate trenches;
depositing a gate dielectric layer in the first and second gate trenches;
depositing a barrier layer in the first and second gate trenches and over the gate dielectric layer;
depositing a p-type work function metal layer in the first and second gate trenches and over the barrier layer;
forming a patterned mask covering the second gate trench;
removing the p-type work function metal layer from the first gate trench, thereby exposing the barrier layer in the first gate trench;
removing the patterned mask after the removing of the p-type work function metal layer from the first gate trench;
treating the barrier layer in the first gate trench to roughen an outer surface of the barrier layer; and
after the treating of the barrier layer, depositing an n-type work function metal layer in the first and second gate trenches.

10. The method of claim 9, wherein the treating of the barrier layer and the depositing of the n-type work function metal layer are performed without breaking vacuum.

11. The method of claim 9, further comprising:
forming a capping layer over the gate dielectric layer before the forming of the barrier layer.

12. The method of claim 9, wherein the gate dielectric layer includes a high-k dielectric material, the barrier layer includes a metal nitride, and the n-type work function metal layer includes aluminum.

13. The method of claim 9, further comprising:
depositing a metal blocking layer over the n-type work function metal layer in the first and second gate trenches.

14. The method of claim 9, wherein the treating of the barrier layer includes applying a metal chloride gas to the barrier layer in the first gate trench.

15. The method of claim 14, wherein the metal chloride gas includes a tungsten chloride.

16. A semiconductor structure, comprising:
a substrate;
a gate stack over the substrate; and
source and drain features adjacent to the gate stack,
wherein the gate stack includes:
a high-k dielectric layer,
a barrier layer over the high-k dielectric layer, the barrier layer having a roughened surface, and
an n-type work function metal layer over the roughened surface.

17. The semiconductor structure of claim 16, wherein the roughened surface has an average surface roughness of 3 to 10 angstroms.

18. The semiconductor structure of claim 16, further comprising a capping layer between the high-k dielectric layer and the barrier layer.

19. The semiconductor structure of claim 18, wherein each of the n-type work function metal layer and the barrier layer includes aluminum, and wherein the gate stack also includes aluminum between the barrier layer and the capping layer.

20. The semiconductor structure of claim 16, wherein:
the n-type work function metal layer includes aluminum and titanium; and
the barrier layer includes aluminum and one of titanium nitride and tantalum nitride,
wherein the gate stack further includes aluminum between the barrier layer and the high-k dielectric layer.

* * * * *